United States Patent [19]

Krekels et al.

[11] Patent Number: 4,833,684
[45] Date of Patent: May 23, 1989

[54] DISTRIBUTED FEEDBACK LASER WITH ANTI-REFLECTION LAYER

[75] Inventors: Henricus C. J. Krekels, Nijmegen; Pieter I. Kuindersma, Eindhoven, both of Netherlands

[73] Assignee: U.S. Philips Corp., New York, N.Y.

[21] Appl. No.: 266,344

[22] Filed: Nov. 1, 1988

Related U.S. Application Data

[63] Continuation of Ser. No. 91,674, Aug. 31, 1987, abandoned.

[30] Foreign Application Priority Data

Sep. 1, 1986 [NL] Netherlands ............... 8602204

[51] Int. Cl.⁴ .................................. H01S 3/19
[52] U.S. Cl. ............................... 372/49; 372/45; 372/46; 372/96; 372/99
[58] Field of Search ................ 372/43, 45, 46, 49, 372/96, 99; 350/164; 357/52

[56] References Cited

U.S. PATENT DOCUMENTS 4,387,960  6/1983  Tani ........................... 350/164

OTHER PUBLICATIONS

Yamaguchi et al; "Highly Efficient Single-Longitudinal-Mode Operation of Antireflection-Coated 1.3 μm DFB-DC-PBHLD"; Electronics Letters; 15 Mar. 1984; vol. 20, No. 6; pp. 233-236.

Primary Examiner—William L. Sikes
Assistant Examiner—B. R. R. Holloway
Attorney, Agent, or Firm—Steven R. Biren

[57] ABSTRACT

A semiconductor laser of the distributed feedback (DFB or DBR) type is bounded in the longitudinal direction by end surfaces at right angles to the active region and at least one of these end faces is provided with an anti-reflection layer in order to suppress Fabry-Pérot modes. In order to obtain an optimum effect, an anti-reflection layer of hafnium oxide is used. The invention is used with great advantage in lasers of the DCPBH (Double Channel Planar Buried Hetero-structure) type.

5 Claims, 2 Drawing Sheets

DISTRIBUTED FEEDBACK LASER WITH ANTI-REFLECTION LAYER

This is a continuation of application Ser. No. 091,674, filed Aug. 31, 1987, now abandoned.

BACKGROUND OF THE INVENTION

The invention relates to a semiconductor laser having a semiconductor body comprising a substrate of a first conductivity type and a layer structure disposed thereon having at least a first passive layer of the first conductivity type, a second passive layer of the second opposite conductivity type and an active layer located between the first and the second passive layer and further comprising a pn junction which can produce, at a sufficiently high current intensity in the forward direction, coherent electromagnetic radiation in a strip-shaped active region located within a resonant cavity, the first and second passive layers having a smaller refractive index for the radiation produced and a larger band gap than the active layer and the resonant cavity being formed by a periodical variation in the effective refractive index in the longitudinal direction and over at least part of the length of the active region. The active region is bounded by end surfaces substantially at right angles to the active region and an anti-reflection layer is provided on at least one of said end surfaces and is in direct contact therewith, the second passive layer and the substrate being electrically connected to connection conductors.

Such a semiconductor laser is described in the article by M. Yamaguchi et al in Electronics Letters, Vol. 20, No. 6, Mar. 15, 1984, p. 223–236.

Semiconductor lasers of different constructions are used in many fields. The resonant cavity can then be formed in different ways. In many cases, it is formed by two parallel extending mirror surfaces, for which use is mostly made of cleavage surfaces of the semiconductor crystal. By repeated reflections on these mirror surfaces, radiation modes known under the dseignation Fabry-Pérot (FP) modes are produced.

According to another embodiment, the resonant cavity is obtained by periodical variation of the effective refractive index for the radiation produced over at least part of the length of the active region. Instead of reflection on mirror surfaces, reflection at a lattice (formed by the said periodical variation in the refractive index) is then used. Lasers in which this is the case are designated as lasers with distributed feedback. They exist in various constructions and are known under the designation "distributed feedback" (DFB) and "distributed bragg reflection" (DBR) lasers. In this Application, they will be designated as "DFB lasers" for the sake of simplicity.

DFB lasers have inter alia the advantage with respect to the aforementioned Fabry-Pérot lasers that they can oscillate more readily in a single stable longitudinal oscillation mode ("Single Longitudinal Mode" or SLM mode) within a large temperature range and at a high output power. This is especially of importance in optical telecommunication applications because in the SLM mode the chromatic dispersion is a minimum so that the signal can be transported without interference over a larger distance through the optical fiber. Further, DFB lasers can be integrated comparatively readily in an electro-optical monolithic circuit.

However, since in general a DFB laser also has, at the ends of the active region, end surfaces at right angles to the active layer, Fabry-Pérot oscillations can also occur between these surfaces so that in principle the DFB laser exhibits at least one FB mode besides at least one DFB mode having substantially the same amplification.

In order to suppress the Fabry-Pérot mode, which is undesirable in DFB lasers, several measures have been suggested, as appears from the aforementioned article by Yamaguchi et al. The most suitable of these measures is that an anti-reflection layer is provided on one of the end faces. If this layer has a thickness corresponding to an optical path length equal to a quarter wavelength of the radiation produced, the reflection coefficient at this end face is reduced to a minimum value. If this value is sufficiently low, the occurrence of FB modes is avoided.

The said minimum value is for the amplitude reflection coefficient theoretically:

$$\delta = (n_1 n_3 - n_2^2)/(n_1 n_3 + n_2^2) \qquad (1),$$

where
$n_1$ = refractive index in the active layer,
$n_2$ = refractive index in the anti-reflection layer, and
$n_3$ = refractive index in the medium (air).

As anti-reflection layers, layers of aluminum oxide and of silicon nitride have been used. These layers are also used frequently in other applications of semiconductor technology and the technique of applying them is therefore well known. However, the use of these layers as anti-reflection layers on a laser has several disadvantages.

For example, aluminum oxide has proved to be less suitable because its refractive index (about 1.65) does not lead to a very low minimum value for the reflection coefficient at least with long-wave lasers ($\lambda = 1.3$ and 1.55 $\mu$m) having a layer structure provided on a substrate of InP which are important for optical telecommunication. As a result, with higher current intensities Fabry-Pérot modes may nevertheless be produced.

Silicon nitride has a refractive index which is more satisfactorily adapted to the application (about 1.85), it is true, but can be applied only by sputter techniques (for example plasma CVD), which is technologically less attractive, inter alia because the material is then deposited not only on the desired end face, but on all parts of the surface. This in contrast, for example, with application by vapor deposition.

SUMMARY OF THE INVENTION

The invention has inter alia for its object to avoid the disadvantages inherent in the usual anti-reflection layers and to provide an anti-reflection layer which can be applied in a comparatively simple manner, preferably by vapor deposition and nevertheless has the desired optical properties for suppressing Fabry-Pérot modes.

According to the invention, a DFB semi-conductor laser of the kind described above is characterized in that the anti-reflection layer consists of halfnium oxide ($HfO_2$).

It has been found that the use of anti-reflection layer of hafnium oxide leads to a considerable increase of the yield of useful lasers. More particularly, this has been ascertained in the manufacture of so-called DFB-DCPBH ("Distributed Feedback Double Channel Planar Buried Hetero-structure") lasers for optical telecommunication purposes, such as those described in the aforementioned article by Yamaguchi et al.

BRIEF DESCRIPTION OF THE DRAWING

The invention will no be described with reference to an embodiment and the drawing, in which.

The Figures are purely schematic and are not drawn to scale. Corresponding parts are generally designated by the same reference numerals. In the cross-sections semiconductor regions of the same conductivity type are hatched in the same direction.

DESCRIPTION OF THE PREFERRED EMBODIMENTS

Figure 1:
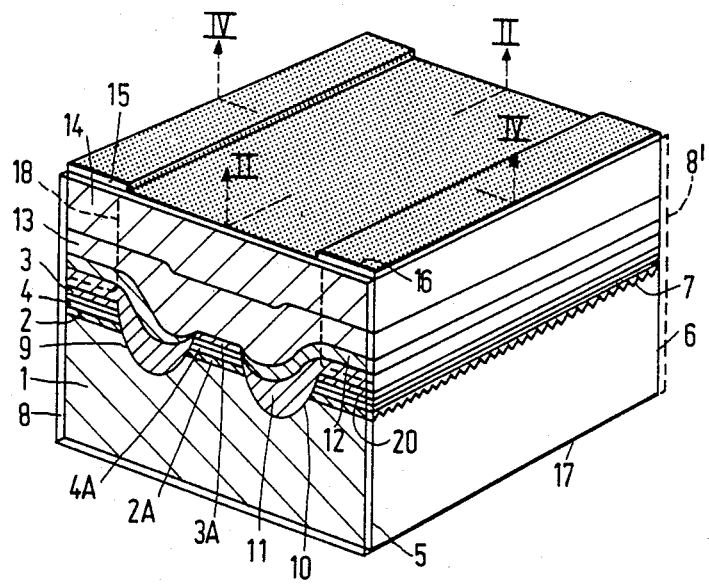
FIG. 1 shows partly in perspective view and partly in cross-section a semiconductor laser according to the invention.

FIG. 1 shows partly in cross-section and partly in perspective view a semiconductor laser according to the invention. The laser comprises a semiconductor body having a substrate 1 of a first conductivity type and a layer structure disposed thereon. This layer structure comprises at least a first passive layer 2 of the said first conductivity type, a second passive layer 3 of the second opposite conductivity type and an active layer 4 located between the first and the second passive layer. A pn junction (whose position depends upon the conductivity type of the semiconductor region located between the layers 2 and 3) is present between the layers 2 and 3 in the layer structure. This pn junction can produce, at a sufficient current intensity in the forward direction, coherent electromagnetic radiation in a strip-shaped region 4A of the active layer 4 located within a resonant cavity. The first and second passive layers 2 and 3 both have for the laser radiation produced a smaller refractive index than the active layer 4 and have a larger band gap than the layer 4.

The resonant cavity is formed by a periodical variation in the refractive index in the longitudinal direction and over at least part of the length of the active region 4A. This variation in the refractive index is obtained by a lattice 7 which is etched into the substrate surface and whose grooves are filled with material of the layer 2, which has an effective refractive index different from that of the substrate 1 for the emitted radiation. The active region 4A is further bounded by end faces 5 and 6 which are substantially at right angles to the active region and at least one of which (the face 5) is provided with an anti-reflection layer 8. The second passive layer 3 and the substrate 1 are electrically connected (via the interposed semiconductor regions) to metal layers, which are provided on the upper and lower surfaces and act as connection conductors and are indicated on the upper surface by a shaded area.

In this embodiment, the substrate 1 consists of indium phosphide (InP) of the n conductivity type. The layer 2 consists of n-type indium-gallium-arsenic phosphide ($In_xGa_{1-x}As_yP_{1-y}$). the active layer 4 also consists of indium-gallium-arsenic phosphide. The layer 3 consists of p-type indium phosphide.

The laser according to this embodiment is of the aforementioned DCPBH type and further comprises a current-limiting layer structure. This structure has two grooves 9 and 10, which bound the active region 4A and in which are provided a layer 11 of p-type InP and a blocking layer 12 of n-type InP. The layers 11 and 12 do not extend on the strip-shaped part 3A of the layer 3 located between the grooves 9 and 10. Further a layer 13 of p-type InP is provided on the assembly and a top layer 14 of $In_xGa_{1-x}As_yP_{1-y}$ is provided thereon, on which a silicon oxide layer 15 is disposed. This oxide layer 15 is provided with a gap-shaped opening, within which an electrode layer 16 provided on the surface is in contact with the layer 14. The lower surface is contacted with an electrode layer 17.

A semiconductor laser of the kind described hereinbefore is known from the aforementioned article by Yamaguchi et al in Electronics Letters, Vol. 20, No. 6, 15, Mar. 1984, p. 233-236.

The anti-reflection layer 8 according to the invention consists of hafnium oxide ($HfO_2$). It has a thickness of about 222 nm.

The refractive index of hafnium oxide for the radiation produced by this laser ($\lambda = 1.55$ $\mu$m) is $n_2 = 1.76$ so tha tthe thickness d of the layer corresponds to an optical path length $n_2 \cdot d = 390$ nm, which is approximately equivalent to ¼ wavelength.

The refractive index $n_1$ of the active layer 4 is 3.15 and that of the surrounding medium $n_3$ is substantially 1 so that according to the aforementioned formula (1)

$$\delta = (n_1 n_3 - n_2^2)/(n_1 n_3 + n_2^2) = 0.006.$$

The resulting reflection coefficient is therefore very low, i.e. considerably lower than, for example, with the use of an anti-reflection layer of aluminum oxide, in which in the given circumstances $\delta$ would be $=0.05$.

Figure 4:
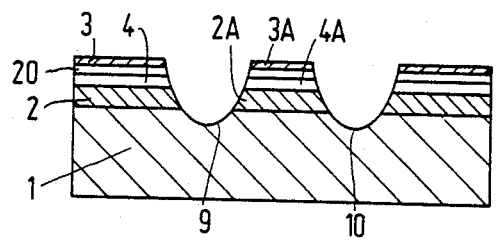

The semiconductor laser described can be manufactured in the following manner. See FIGS. 2 to 6, FIGS. 2, 3 and 6 being cross-sections taken on the line II—II of FIG. 1 and FIGS. 4 and 5 being cross-sections taken on the line IV—IV.

The starting material is a substrate 1 of n-type indium phosphide having a thickness of about 360 $\mu$m, a (100) orientation and a doping concentration of, for example, $5 \cdot 10^{18}$ atoms/cm$^3$. This substrate may be a single substrate, but may also be constituted by an epitaxial layer grown onto an underlying carrier body.

Figure 2:
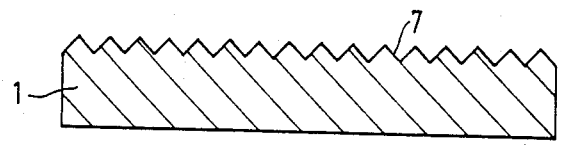
FIGS. 2 to 6 show the semiconductor laser according to the invention at successive stages of manufacture, FIGS. 2, 3 and 6 showing cross-sections taken on the line II—II and FIGS. 4 and 5 showing cross-sections taken on the line IV—IV of FIG. 1.
Figure 3:
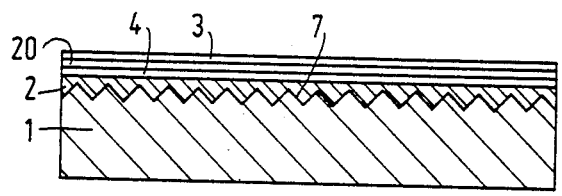

A diffraction lattice having a lattice constant of 240 nm is then etched into the upper surface of this substrate (cf. FIG. 2). For this purpose, first a photoresist layer having a thickness of 100 nm is provided on the surface. By means of holographic exposure, while using the 363.8 nm line of an argon laser, a raster-shaped pattern is formed from this photoresist layer. This pattern is used as a mask in an etching process, in which a pattern 7 of parallel grooves is etched into the upper surface of the substrate, for example by means of a solution of hydrobromide (HBr) in water.

After the photoresist mask has been removed, a layer 2 having a thickness of about 0.12 $\mu$m and the composition $In_{0.72}Ga_{0.28}As_{0.60}P_{0.40}$ is grown from the liquid phase by means of usual techniques, this layer filling entirely the grooves in the substrate surface. A 0.12 $\mu$m thick layer 4 of undoped $In_{0.57}Ga_{0.43}As_{0.91}P_{0.009}$ is grown thereon and then a so-called anti-melt back layer 20 of $In_{0.72}Ga_{0.28}As_{0.60}P_{0.40}$ having a thickness of 0.05 $\mu$m is grown thereon and a p-type indium phosphide layer 3 having a thickness of 0.7 $\mu$m is grown thereon (cf. FIG. 3). After these growing processes, the depth of the raster grooves 7 in the InP substrate is approximately 70 nm.

Subsequently (cf. FIG. 4) grooves 9 and 10 are etched into the structure thus obtained, which are at right angles to the end faces 5 and 6 and to the direction of the grooves of the raster 7. The grooves 9 and 10 extend into the substrate 1 and can be etched with an etchant, such as, for example, bromomethanol. They have a width on the upper side of about 9 μm and a depth of 3 μm. The MESA (2A,3A,4A) located between the grooves has on the upper side a width of about 0.9 μm.

Subsequently, the whole is placed again in the growing apparatus. First (cf. FIG. 5) a p-type indium phosphide layer 11 is grown having a doping of $8\cdot10^{17}$ Zn atoms/cm$^3$ and on this layer is grown an n-type blocking layer 12 of indium phosphide having a doping of $8\cdot10^{17}$ germanium atoms/cm$^3$. These layers have a thickness of about 0.5 μm on the flat part of the structure outside the grooves 9, 10 and the mesa. They partly fill the grooves, but do not grow on the mesa.

Subsequently, a p-type indium phosphide layer 13 having a thickness of, for example, 1 μm and a doping concentration of $8\cdot10^{17}$ Zn atoms/cm$^3$ and a p-type layer 14 having the composition $In_{0.72}Ga_{0.28}As_{0.60}P_{0.40}$, a thickness of 1 μm and a doping concentration of $2\cdot10^{18}$ Zn atoms/cm$^3$ are grown.

Figure 5:
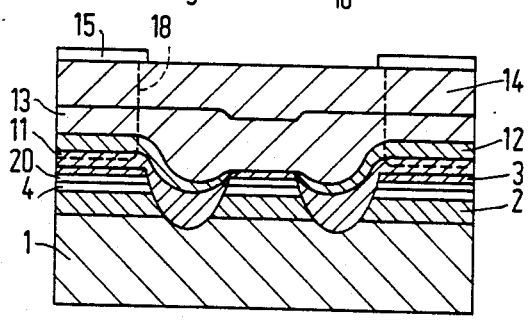

An oxide layer 15 is now formed on the assembly and from this layer a strip having a width of about 10 μm is etched away above the grooves 9 and 10 and the intermediate region (cf. FIG. 5). In order to obtain a good ohmic contact, zinc is diffused via this strip, after which the electrode layers 16 and 17 are provided. If desired, moreover the semiconductor regions 18 bounded by dotted lines and located outside the active region are made practically insulating, for example, by a proton bombardment. Further details with regard to the manufacture of the structure which are not essential to the present invention can be derived from the European patent application No. 161016 published on Nov. 13, 1985.

Figure 6:
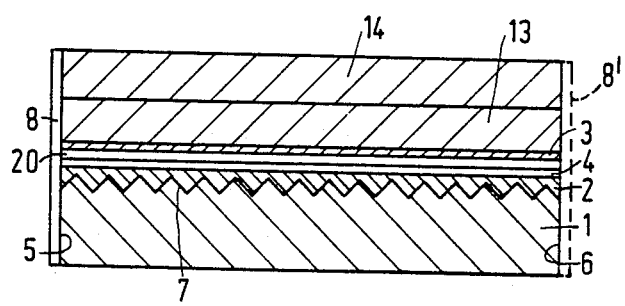

By vapor deposition, an anti-reflection layer 8 of hafnium oxide (HfO$_2$) having a thickness of ±222 nm is deposited on one of the end faces of the laser, in this case the end face 5 (cf. FIG. 6). This corresponds to an optical path length of λ/4 for the emitted radiation, which in this case has a wavelength λ=1.55 μm.

It has been found that the use of an anti-reflection layer of hafnium oxide provides a considerably higher yield of serviceable lasers, i.e. lasers osciallating in the DFB mode, than in the case of anti-reflection layers consisting of other materials, such as, for example, aluminum oxide (Al$_2$O$_3$) for laser diodes manufactured on and from the same semiconductor wafer. The number of lasers operating in one radiation mode (SLM mode) is considerably larger with lasers coated with HfO$_2$ than with lasers provided with other anti-reflection layers.

Although in this Application the invention is described with reference to the DCPBH laser structure which is very important for optical telecommunication, the use of an anti-reflection layer of hafnium oxide is also of major importance for other laser structures of the DFB type for the same reasons as for the laser described, in order to obtain a suppression as efficient as possible of Fabry-Pérot modes and of radiation in a single oscillation mode. The invention is therefore not limited to the embodiment described, but relates to all forms of lasers in which the resonant cavity is formed by periodical variation of the effective refractive index over at least part of the length of the active region. Further, although in the embodiment described an anti-reflection layer 8 of hafnium oxide is provided only on the surface 5, such an anti-reflection layer 8 may also be provided on the second end surface 6, as is indicated by dotted lines in FIGS. 1 and 6. Thus, there is more certainty that no Fabry-Pérot oscillations will occur.

What is claimed is:

1. A semiconductor laser having a semiconductor body comprising a substrate of a first conductivity type, a resonant cavity, and a layer structure disposed thereon having at least a first passive layer of the first conductivity type, a second passive layer of the second opposite conductivity type and an active layer located between the first and the second passive layers and having a stripe-shaped active region within said resonant cavity, further comprising a pn junction which can produce, at a sufficiently high current intensity in the forward direction, coherent electromagnetic radiation in said stripe-shaped active region, the first and second passive layers having a smaller refractive index for the radiation produced and a larger band gap than the active layer and the resonant cavity being formed by periodical variation in the effective refractive index in the longitudinal direction and over at least part of the length of the active region, the active region being bounded by end surfaces substantially at right angles to the active region and an anti-reflection layer being provided on at least one of said end surfaces and in direct contact therewith, the second passive layer and the substrate being electrically connected to connection conductors, and the anti-reflection layer consisting of hafnium oxide (HfO$_2$).

2. A semiconductor laser as claimed in claim 1, characterized in that the anti-reflection layer has a thickness corresponding to an optical path length of a quarter wavelength for the radiation produced by the laser.

3. A semiconductor laser as claimed in claim 1 or 2, characterized in that the anti-reflection layer is provided on both said end surfaces.

4. A semiconductor laser as claimed in claim 1 or 2, characterized in that the laser is of the DCPBH (Double Channel Planar Buried Hetero-structure) type.

5. A semiconductor laser as claimed in claim 1 or 2, characterized in that the substrate comprises of n-type indium phosphide (InP) and in that the active layer comprises of indium-gallium-arsenic phosphide ($In_x$-$Ga_{1-x}As_yP_{1-y}$).

* * * * *